(12) United States Patent
Kim et al.

(10) Patent No.: US 10,032,792 B2
(45) Date of Patent: Jul. 24, 2018

(54) SEMICONDUCTOR DEVICE AND MANUFACTURING METHOD THEREOF

(71) Applicant: ASM IP Holding B.V., Almere (NL)

(72) Inventors: Young Jae Kim, Chungcheongnam-do (KR); Seung Woo Choi, Chungcheongnam-do (KR); Yong Min Yoo, Seoul (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/798,120

(22) Filed: Oct. 30, 2017

(65) Prior Publication Data

US 2018/0047749 A1    Feb. 15, 2018

Related U.S. Application Data

(63) Continuation of application No. 14/938,180, filed on Nov. 11, 2015, now Pat. No. 9,899,405.

(30) Foreign Application Priority Data

Dec. 22, 2014   (KR) .......................... 10-2014-0186115

(51) Int. Cl.
| | |
|---|---|
| *H01L 21/20* | (2006.01) |
| *H01L 21/36* | (2006.01) |
| *H01L 27/11582* | (2017.01) |
| *H01L 21/225* | (2006.01) |
| *H01L 21/28* | (2006.01) |

(52) U.S. Cl.
CPC .... *H01L 27/11582* (2013.01); *H01L 21/2255* (2013.01); *H01L 21/28282* (2013.01)

(58) Field of Classification Search
CPC ........... H01L 21/28282; H01L 27/1157; H01L 27/11582
See application file for complete search history.

(56) References Cited

U.S. PATENT DOCUMENTS

| | | | | |
|---|---|---|---|---|
| 2010/0006923 | A1* | 1/2010 | Fujitsuka | .......... H01L 21/28282 257/324 |
| 2010/0248465 | A1* | 9/2010 | Yi | ...................... H01L 21/02164 438/591 |
| 2011/0159680 | A1* | 6/2011 | Yoo | ........................ C23C 16/403 438/591 |
| 2012/0040528 | A1* | 2/2012 | Kim | .................. H01L 21/76816 438/675 |
| 2014/0061770 | A1* | 3/2014 | Lee | ................... H01L 29/66825 257/324 |

* cited by examiner

*Primary Examiner* — Joseph C Nicely
*Assistant Examiner* — Wilner Jean Baptiste
(74) *Attorney, Agent, or Firm* — Snell & Wilmer L.L.P.

(57) ABSTRACT

Disclosed are a semiconductor device and a manufacturing method thereof. According to the semiconductor device and the manufacturing method thereof according to exemplary embodiments of the present invention, after the dopant source layer is uniformly deposited on a channel layer of the device with the 3-dimensional vertical structure by the plasma-enhanced atomic layer deposition (PEALD) method, the deposited dopant source layer is heat-treated so that the dopants are diffused into the channel layer to function as charge carriers, thereby preventing the charges in the channel layer from being reduced. According to the exemplary embodiments of the present invention, the diffusion speed and concentration of the dopant may be controlled by forming the barrier layer between the channel layer and the dopant source layer.

16 Claims, 3 Drawing Sheets

SEMICONDUCTOR DEVICE AND MANUFACTURING METHOD THEREOF

CROSS-REFERENCE TO RELATED APPLICATION

This application is a continuation of U.S. patent application Ser. No. 14/938,180 filed Nov. 11, 2015, which claims priority to and the benefit of Korean Patent Application No. 10-2014-0186115 filed in the Korean Intellectual Property Office on Dec. 22, 2014, the entire contents of which are incorporated herein by reference.

BACKGROUND OF THE INVENTION

(a) Field of the Invention

The present invention relates to a semiconductor device and a manufacturing method thereof.

(b) Description of the Related Art

Recently, although a flash memory semiconductor has been highly integrated, there is a limit in improvement of the degree of integration due to a physical limit such as an increase of current leakage in a channel according to a conventional 2-dimensional gate structure.

Thus, a novel structure that is able to substitute for the conventional 2-dimensional gate structure, for example, a 3-dimensional vertical NAND (3D VNAND) flash memory that overcomes the limit of the degree of integration by vertically stacking gate structures, has attracted attention. However, since charge distribution is non-uniform in the vertically stacked polysilicon channel layer of the 3D VNAND device, the 3D VNAND device may not be normally operated.

The above information disclosed in this Background section is only to enhance the understanding of the background of the invention and therefore it may contain information that does not form the prior art that is already known in this country to a person of ordinary skill in the art.

SUMMARY OF THE INVENTION

The present invention has been made in an effort to provide a semiconductor device and a manufacturing method thereof that may prevent a reduction of charge from being able to occur in a channel layer of a 3-dimensional vertical NAND flash memory.

An exemplary embodiment of the present invention provides a semiconductor device, including: a structure in which a gate layer and an interlayer insulation layer are alternately stacked; a non-conductive layer formed at a lateral surface of the structure; a channel layer formed at a lateral surface of the non-conductive layer; a barrier layer formed at a lateral surface of the channel layer; and a source layer formed at a lateral surface of the barrier layer.

The source layer may contain phosphorous elements.

The source layer may be a phosphosilicate glass (PSG) layer.

The non-conductive layer may be an oxide-nitride-oxide (ONO) layer.

The channel layer may be a polysilicon layer.

The semiconductor device may further include a capping layer formed at a lateral surface of the source layer.

The barrier layer and the capping layer may be silicon oxide layers.

The barrier layer and the capping layer may be silicon oxide layers having different film qualities or different thicknesses.

Another embodiment of the present invention provides a manufacturing method of a semiconductor device, including: forming a non-conductive layer to be perpendicular to a surface of a substrate in a trench of a structure in which a gate layer and an interlayer insulation layer are alternately stacked; forming a channel layer to be perpendicular to the surface of the substrate at a lateral surface of the non-conductive layer; repeating a first gas-supplying cycle for forming a barrier layer to be perpendicular to the surface of the substrate at a lateral surface of the channel layer; and repeating a second gas-supplying cycle for forming a source layer at a lateral surface of the barrier layer, wherein the first gas-supplying cycle and the second gas-supplying cycle may be performed by an atomic layer deposition method.

The first gas-supplying cycle may include: while supplying oxygen gas and a purge gas to a reactor during a first time, a second time, a third time, and a fourth time, supplying a silicon source during the first time; and activating the oxygen gas with plasma during the third time.

The second gas-supplying cycle may include a first sub-gas-supplying cycle and a second sub-gas-supplying cycle, wherein while supplying the oxygen gas and the purge gas to the reactor during a fifth time, a sixth time, a seventh time, an eighth time, a ninth time, and a tenth time, the first sub-gas-supplying cycle includes a step of supplying a silicon source gas during the fifth time without supplying plasma and a step of stopping supplying of the silicon source gas during the sixth time, and the second sub-gas-supplying cycle includes a step of supplying a phosphorous source gas during the seventh time and a step of supplying plasma during the ninth time.

A number of repetitions of the first sub-gas-supplying cycle and a number of repetitions of the second sub-gas-supplying cycle may be different.

The manufacturing method of the semiconductor device may further include repeating a third gas-supplying cycle for forming a capping layer at a lateral surface of the source layer.

The third gas-supplying cycle may include: while supplying the oxygen gas and the purge gas to the reactor during an eleventh time, a twelfth time, a thirteenth time, and a fourteenth time, supplying the silicon source during the eleventh time; and activating the oxygen gas with the plasma during the thirteenth time.

Conditions of the first gas-supplying cycle and the third gas-supplying cycle may be different.

The manufacturing method of the semiconductor device may further include performing heat treatment to the semiconductor device.

The step of forming of the channel layer may include forming the channel layer as a polysilicon layer.

According to the embodiments of the present invention, it is possible to prevent a reduction of charge and imbalance of charge distribution from occurring in a channel layer with a 3-dimensional vertical structure.

DETAILED DESCRIPTION OF THE EMBODIMENTS

Figure 1:
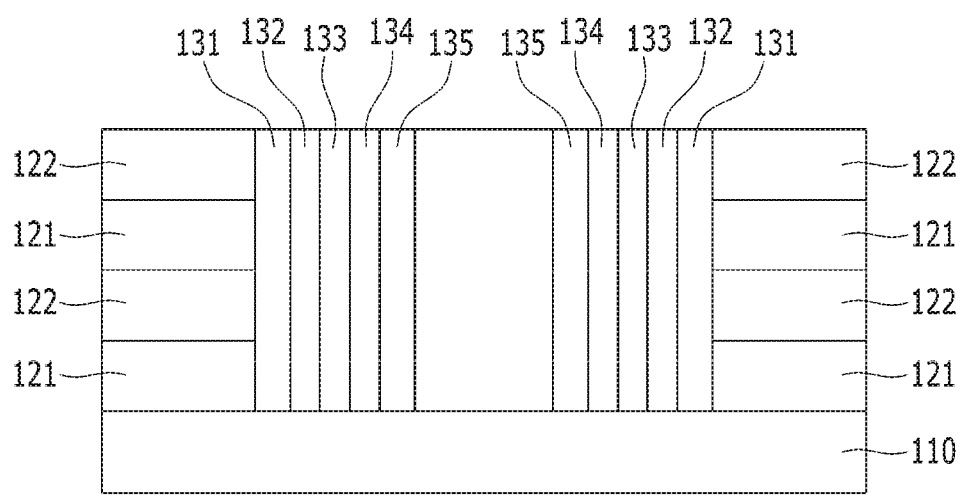
FIG. 1 illustrates a cross-sectional view of a semiconductor device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, a semiconductor device according to an exemplary embodiment of the present invention will be described with reference to FIG. 1. FIG. 1 illustrates a cross-sectional view of a semiconductor device according to an exemplary embodiment of the present invention.

Referring to FIG. 1, a gate layer 121 and an interlayer insulation layer 122 are alternately stacked on a substrate 110. The gate layer 121 may be formed of a metal layer, or may be made of a conductive material such as doped polysilicon. The interlayer insulation layer 122 may include a silicon oxide (SiO2).

A trench is formed in a structure in which the gate layer 121 and the interlayer insulation layer 122 are alternately stacked, and a non-conductive layer 131, a channel layer 132, a barrier layer 133, a source layer 134, and a capping layer 135 are sequentially formed in the trench. The non-conductive layer 131, the channel layer 132, the barrier layer 133, the source layer 134, and the capping layer 135 are formed to be perpendicular to a surface of the gate layer 121 in the trench, and are sequentially formed at a lateral surface of the structure in which the gate layer 121 and the interlayer insulation layer 122 are alternately stacked.

The non-conductive layer 131, the channel layer 132, the barrier layer 133, the source layer 134, and the capping layer 135 are vertically formed to be perpendicular to the surface of the gate layer 121 along the lateral surface of the structure in which the gate layer 121 and the interlayer insulation layer 122 are alternately stacked.

The non-conductive layer 131 may be formed as an oxide-nitride-oxide (ONO) layer. More specifically, the non-conductive layer 131 may have a structure in which a silicon oxide layer, a silicon nitride layer, and a silicon oxide layer (SiO2/SiN/SiO2) are stacked. The non-conductive layer 131 serves to trap charges in the channel layer 132.

The channel layer 132 may be a polysilicon layer.

The barrier layer 133 may be formed of a silicon oxide (SiO2) layer.

The source layer 134, which supplies dopants, may be a layer containing a phosphorous element. For example, the source layer 134 may be a phosphosilicate glass (PSG) layer.

By performing heat treatment after forming the barrier layer 133 and the source layer 134 on the channel layer 132, the dopants in the source layer 134 are diffused into the channel layer 132, and by the dopant acting as a carrier, it is possible to prevent charge concentration from decreasing or charge distribution from being imbalanced in the channel layer 132.

The barrier layer 133, when the dopants supplied from the source layer 134 are diffused into the channel layer 132, serves to control diffusion concentration and speed.

The capping layer 135 may be formed of a silicon oxide (SiO2) layer. The capping layer 135 prevents the dopants from being diffused in an opposite direction.

The barrier layer 133 and the capping layer 135 may be different in layer properties such as density and thickness to be suitable for their functions.

The capping layer 135 may be etched and removed in a subsequent process.

Figure 2:
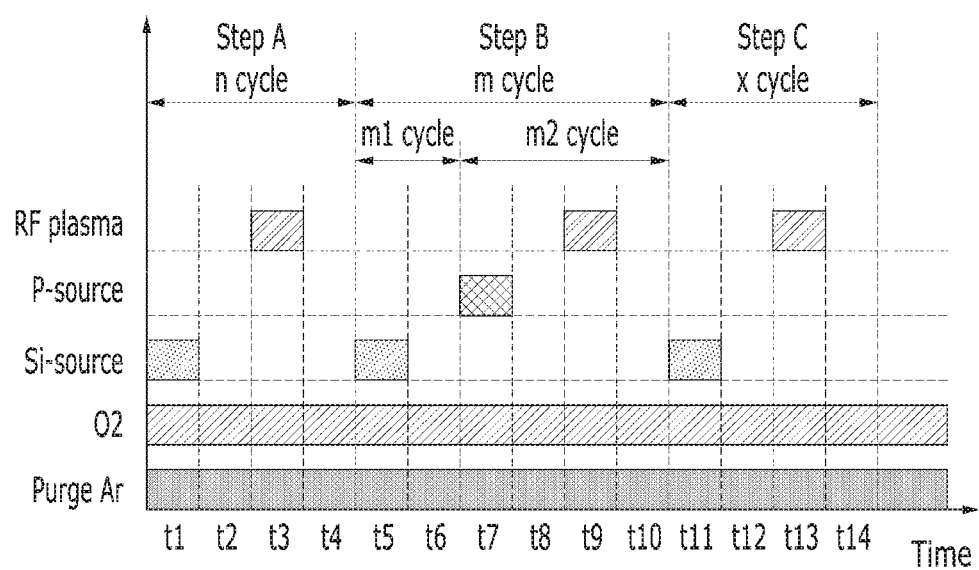
FIG. 2 illustrates a schematic timing chart of a gas-supplying cycle in a manufacturing method of a semiconductor device according to an exemplary embodiment of the present invention.

Next, a manufacturing method of a semiconductor device according to an exemplary embodiment of the present invention will be described with reference to FIG. 2. FIG. 2 illustrates a schematic timing chart of a gas-supplying cycle in a manufacturing method of a semiconductor device according to an exemplary embodiment of the present invention.

Referring to FIG. 2, a manufacturing method of a semiconductor device according to an exemplary embodiment of the present invention includes a first step (step A) of repeating a first gas-supplying cycle (n-cycle), a second step (step B) of repeating a second gas-supplying cycle (m cycle), and a third step (step C) of repeating a third gas-supplying cycle (x cycle).

In the first step (step A), the first gas-supplying cycle (n-cycle) is repeated a predetermined number of times. The first gas-supplying cycle (n-cycle) includes a step of activating oxygen gas by supplying oxygen gas and a purge gas (argon gas (purge Ar)) to a reactor during a first time t1, a second time t2, a third time t3, and a fourth time t4, supplying a silicon source thereto during the first time t1, and supplying plasma thereto during the third time t3.

By repeating the first gas-supplying cycle (n-cycle), the barrier layer 133 is formed on the channel layer 132. The barrier layer 133 is formed through the first step (step A) of repeating the first gas-supplying cycle (n-cycle) until the barrier layer 133 having a predetermined thickness is formed.

Here, only the activated oxygen gas reacts with the silicon source. Thus, the oxygen gas acts as the purge gas while the plasma is not supplied.

A thickness of the barrier layer 133 may be about 10 to 20 Å. The silicon source (Si source) may be an aminosilane-based, halide-based, or chloride-based material that contains silicon (Si).

In the second step (step B), the second gas-supplying cycle (m cycle) is repeated a predetermined number of times.

The second gas-supplying cycle (n cycle) includes a first sub-gas-supplying cycle (m1 cycle) and a second sub-gas-supplying cycle (m2 cycle). In the first sub-gas-supplying cycle (m1 cycle), while supplying the oxygen gas and purge argon gas (purge Ar) to the reactor during a fifth time t5, a sixth time t6, a seventh time t7, an eighth time t8, a ninth time t9, and a tenth time t10, the silicon source gas is supplied during the fifth time t5 without supplying the plasma, and the supplying of the silicon source gas stops during the sixth time t6. In the second sub-gas-supplying cycle (m2 cycle), while supplying the oxygen gas and the purge argon gas (purge Ar) to the reactor during the fifth time t5, the sixth time t6, the seventh time t7, the eighth time t8, the ninth time t9, and the tenth time t10, a phosphorous source gas is supplied during the seventh time t7, and the plasma is supplied during the ninth time t9. The silicon source is supplied in the first sub-gas-supplying cycle (m1 cycle), and in the second sub-gas-supplying cycle (m2 cycle), the phosphorous source gas and the activated oxygen gas by the plasma react such that phosphorus oxide (PO) layers are stacked.

In the second step (step B) in which the first sub-gas-supplying cycle (m1 cycle) and the second sub-gas-supplying cycle (m2 cycle) are repeated, the phosphosilicate glass (PSG) layer, which is the source layer 134, is formed.

In this case, the silicon source (Si source) may be an aminosilane-based, halide-based, or chloride-based material that contains silicon (Si), and the phosphorous source may be an organic metal source that contains phosphorous.

In the second step (step B), by adjusting a repetition ratio of the first sub-gas-supplying cycle (m1 cycle) and the second sub-gas-supplying cycle (m2 cycle), a phosphorus content of the phosphosilicate glass (PSG) layer may be controlled, and a concentration of the phosphorus, which is the dopant diffused into the channel layer 132, may be controlled.

In the third step (step C), the third gas-supplying cycle (x cycle) is repeated a predetermined number of times.

The third gas-supplying cycle (x cycle) includes a step of activating oxygen gas by supplying the oxygen gas and the purge gas, argon gas (purge Ar) to the reactor during an eleventh time t11, a twelfth time t12, a thirteenth time t13, and a fourteenth time t14, supplying the silicon source thereto during the eleventh time t11, and supplying plasma thereto during the thirteenth time t13.

By repeating the third gas-supplying cycle (x cycle), the capping layer 135 is formed on the source layer 134. The capping layer 135 is formed through the third step (step C) of repeating the third gas-supplying cycle (x cycle) until the capping layer 135 having a predetermined thickness is formed.

In this case, the silicon source (Si source) may be an aminosilane-based, halide-based, or chloride-based material that contains silicon (Si).

The first step (step A) of forming the barrier layer 133 and the third step (step C) of forming the capping layer 135 may have different deposition conditions.

More specifically, it is possible to increase density of the silicon oxide layer by increasing plasma power supplied during the third step (step C) of forming the capping layer 135 compared to the first step (step A) of forming the barrier layer 133, and it is possible to increase a thickness of the silicon oxide layer by increasing the number of repetitions of the third step (step C) of forming the capping layer 135 compared to the first step (step A). The thickness of the capping layer 135 may be about 50 Å, and the thickness of the barrier layer 133 may be about 10 Å or 20 Å.

As such, by changing the deposition conditions depending on the functions of the barrier layer 133 and the capping layer 135, it is possible to form a silicon oxide layer with appropriate film quality.

For example, although phosphorus elements, which are the dopants of the source layer 134, may be diffused into the channel layer 132 through the barrier layer 133, the barrier layer 133 and the capping layer 135 with different film qualities may be formed by differently setting processing conditions of the barrier layer 133 and the capping layer 135 so that the phosphorus elements are not diffused through the capping layer 135.

The manufacturing method of the semiconductor device according to the exemplary embodiment of the present invention may use an in-situ method and a direct plasma-processing method in the first step (step A) of repeating the first gas-supplying cycle (n-cycle), the second step (step B) of repeating the second gas-supplying cycle (m cycle), and the third step (step C) of repeating the third gas-supplying cycle (x cycle). In a manufacturing method of a semiconductor device according to another exemplary embodiment of the present invention, a remote plasma method of supplying the plasma from the outside of the reactor may be used.

As such, according to the manufacturing method of the semiconductor device according to the exemplary embodiment of the present invention, the barrier layer, the dopant source layer, and the capping layer are deposited by an atomic layer deposition method, for example, a plasma-enhanced atomic layer deposition (PEALD) method using plasma. That is, the barrier layer, the dopant source layer, and the capping layer may be formed by the plasma-enhanced atomic layer deposition (PEALD) method, thereby forming a uniform thin film (or layer). Particularly, the barrier layer, the dopant source layer, and the capping layer may be uniformly deposited at a low temperature inside a trench structure that is vertically and thickly stacked and has a high aspect ratio.

A manufacturing method of the semiconductor device according to another exemplary embodiment of the present invention further includes a step of performing heat treatment, after the first step (step A) of repeating the first gas-supplying cycle (n-cycle), the second step (step B) of repeating the second gas-supplying cycle (m cycle), and the third step (step C) of repeating the third gas-supplying cycle (x cycle).

By performing the heat treatment, the dopants in the source layer 134 are diffused into the channel layer 132 through the barrier layer 133. However, the dopants in the source layer 134 may not be diffused through the capping layer 135. The step of performing the heat treatment may proceed for about 1 hr at a temperature of about 600° C.

Figure 3:
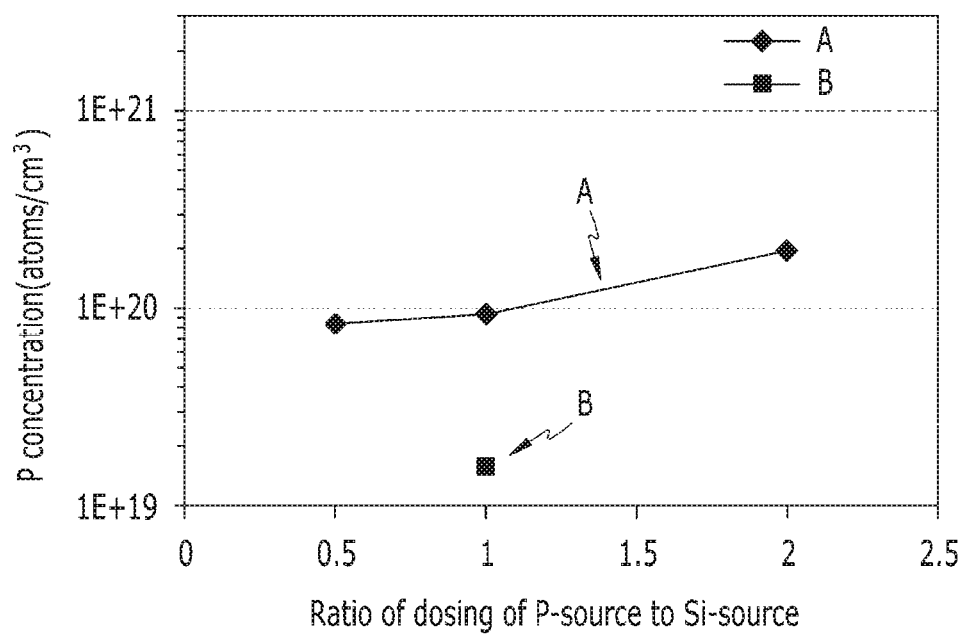
FIG. 3 illustrates a graph of results of an experimental example of the present invention.

An experimental example of the present invention will now be described with reference to FIG. 3. FIG. 3 illustrates a graph of results of an experimental data of the present invention.

In the experimental data, while changing supply ratios of the phosphorous source gas (P-source) to the silicon source gas (Si-source) with respect to a first case (A) in which the barrier layer is not formed and a second case (B) in which the barrier layer is formed, diffusion concentrations of the phosphorus in the channel layer are measured, and the measured results are shown in FIG. 3. The diffusion concentration of the phosphorus in the channel layer was measured by secondary ion mass spectrometry (SIMS).

Referring to FIG. 3, as the supply ratio of the phosphorous source gas to the silicon source gas increases, it can be seen that the concentration of the phosphorus diffused into the channel layer increases, and when the barrier layer is formed, it can be seen that the concentration of the phosphorus diffused into the channel layer decreases (B) compared to when the barrier layer is not formed (A).

As such, by using the source layer, which is the dopant source, and the barrier layer, it can be seen that dopants of a predetermined concentration may be diffused into the channel layer such that the reduction of the charge concentration in the channel layer may be prevented.

As described above, according to the semiconductor device the manufacturing method thereof according to the exemplary embodiments of the present invention, after the dopant source layer is uniformly deposited on a channel layer of the device with the 3-demensional vertical structure by the plasma-enhanced atomic layer deposition (PEALD) method, the deposited dopant source layer is heat-treated so that the dopants are diffused into the channel layer to function as charge carriers, thereby preventing the charges in the channel layer from being reduced.

Further, according to the exemplary embodiments of the present invention, the diffusion speed and concentration of the dopant may be controlled by forming the barrier layer between the channel layer and the dopant source layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of a semiconductor device, comprising:
   forming a non-conductive layer to be perpendicular to and directly on a surface of a substrate in a trench of a structure in which a gate layer and an interlayer insulation layer are alternately stacked;
   forming a channel layer to be perpendicular to the surface of the substrate at a lateral surface of the non-conductive layer;
   repeating a first gas-supplying cycle for forming a barrier layer to be perpendicular to the surface of the substrate at a lateral surface of the channel layer; and
   repeating a second gas-supplying cycle for forming a source layer, comprising one or more dopants, at a lateral surface of the barrier layer,
   wherein the first gas-supplying cycle and the second gas-supplying cycle are performed by an atomic layer deposition method,
   wherein the one or more dopants diffuse through the barrier layer to the channel layer, and
   wherein the one or more dopants function as charge carriers within the channel layer.

2. The manufacturing method of the semiconductor device of claim 1, wherein the first gas-supplying cycle includes,
   while supplying oxygen gas and a purge gas to a reactor during a first time, a second time, a third time, and a fourth time:
   supplying a silicon source during the first time; and
   activating the oxygen gas with plasma during the third time.

3. The manufacturing method of the semiconductor device of claim 2, wherein
   the second gas-supplying cycle includes a first sub-gas-supplying cycle and a second sub-gas-supplying cycle, wherein,
   while supplying the oxygen gas and the purge gas to the reactor during a fifth time, a sixth time, a seventh time, an eighth time, a ninth time, and a tenth time,
   the first sub-gas-supplying cycle includes a step of supplying a silicon source gas during the fifth time without supplying the plasma and a step of stopping supplying of the silicon source gas during the sixth time, and
   the second sub-gas-supplying cycle includes a step of supplying phosphorous source gas during the seventh time and a step of supplying plasma during the ninth time.

4. The manufacturing method of the semiconductor device of claim 3, wherein a number of repetitions of the first sub-gas-supplying cycle and a number of repetitions of the second sub-gas-supplying cycle are different.

5. The manufacturing method of the semiconductor device of claim 2, further comprising repeating a third gas-supplying cycle for forming a capping layer at a lateral surface of the source layer.

6. The manufacturing method of the semiconductor device of claim 5, wherein
   the third gas-supplying cycle includes:
   while supplying the oxygen gas and the purge gas to the reactor during an eleventh time, a twelfth time, a thirteenth time, and a fourteenth time,
   supplying the silicon source during the eleventh time; and
   activating the oxygen gas with the plasma during the thirteenth time.

7. The manufacturing method of the semiconductor device of claim 5, wherein conditions of the first gas-supplying cycle and the third gas-supplying cycle are different.

8. The manufacturing method of the semiconductor device of claim 5, further comprising performing heat treatment to the semiconductor device.

9. The manufacturing method of the semiconductor device of claim 6, wherein the plasma powers supplied during the first gas-supplying cycle and the third gas-supplying cycle are different.

10. The manufacturing method of the semiconductor device of claim 7, wherein the thickness of the films formed in the first gas-supplying cycle and the third gas-supplying cycle are different.

11. The manufacturing method of the semiconductor device of claim 1, further comprising performing heat treatment to the semiconductor device to cause the one or more dopants to diffuse from the source layer to the channel layer.

12. The manufacturing method of the semiconductor device of claim 1, wherein the forming of the channel layer includes forming the channel layer as a polysilicon layer.

13. A manufacturing method of a semiconductor device, comprising:
   forming a non-conductive layer to be perpendicular to and directly on a surface of a substrate in a trench of a structure in which a gate layer and an interlayer insulation layer are alternately stacked;
   forming a channel layer to be perpendicular to the surface of the substrate at a lateral surface of the non-conductive layer;
   repeating a first gas-supplying cycle for forming a barrier layer to be perpendicular to the surface of the substrate at a lateral surface of the channel layer; and
   repeating a second gas-supplying cycle for forming a source layer, comprising one or more dopants, at a lateral surface of the barrier layer,
   wherein the first gas-supplying cycle and the second gas-supplying cycle are performed by an atomic layer deposition method,
   wherein the one or more dopants diffuse through the barrier layer to the channel layer, wherein the first gas-supplying cycle includes,
   while supplying oxygen gas and a purge gas to a reactor during a first time, a second time, a third time, and a fourth time:

supplying a silicon source during the first time; and
activating the oxygen gas with plasma during the third time, wherein
the second gas-supplying cycle includes a first sub-gas-supplying cycle and a second sub-gas-supplying cycle, wherein,
while supplying the oxygen gas and the purge gas to the reactor during a fifth time, a sixth time, a seventh time, an eighth time, a ninth time, and a tenth time,
the first sub-gas-supplying cycle includes a step of supplying a silicon source gas during the fifth time without supplying the plasma and a step of stopping supplying of the silicon source gas during the sixth time, and
the second sub-gas-supplying cycle includes a step of supplying phosphorous source gas during the seventh time and a step of supplying plasma during the ninth time.

14. The manufacturing method of the semiconductor device of claim 13, wherein a number of repetitions of the first sub-gas-supplying cycle and a number of repetitions of the second sub-gas-supplying cycle are different.

15. A manufacturing method of a semiconductor device, comprising:
forming a non-conductive layer to be perpendicular to a surface of a substrate in a trench of a structure in which a gate layer and an interlayer insulation layer are alternately stacked;
forming a channel layer to be perpendicular to the surface of the substrate at a lateral surface of the non-conductive layer;
repeating a first gas-supplying cycle for forming a barrier layer to be perpendicular to the surface of the substrate at a lateral surface of the channel layer; and
repeating a second gas-supplying cycle for forming a source layer, comprising one or more dopants, at a lateral surface of the barrier layer,
wherein the first gas-supplying cycle and the second gas-supplying cycle are performed by an atomic layer deposition method,
wherein the one or more dopants diffuse through the barrier layer to the channel layer, wherein
the first gas-supplying cycle includes,
while supplying oxygen gas and a purge gas to a reactor during a first time, a second time, a third time, and a fourth time:
supplying a silicon source during the first time; and
activating the oxygen gas with plasma during the third time;
further comprising repeating a third gas-supplying cycle for forming a capping layer at a lateral surface of the source layer, wherein
the third gas-supplying cycle includes:
while supplying the oxygen gas and the purge gas to the reactor during an eleventh time, a twelfth time, a thirteenth time, and a fourteenth time,
supplying the silicon source during the eleventh time; and
activating the oxygen gas with the plasma during the thirteenth time.

16. A manufacturing method of a semiconductor device, comprising:
forming a non-conductive layer to be perpendicular to a surface of a substrate in a trench of a structure in which a gate layer and an interlayer insulation layer are alternately stacked;
forming a channel layer to be perpendicular to the surface of the substrate at a lateral surface of the non-conductive layer;
repeating a first gas-supplying cycle for forming a barrier layer to be perpendicular to the surface of the substrate at a lateral surface of the channel layer; and
repeating a second gas-supplying cycle for forming a source layer, comprising one or more dopants, at a lateral surface of the barrier layer,
wherein the first gas-supplying cycle and the second gas-supplying cycle are performed by an atomic layer deposition method,
wherein the one or more dopants diffuse through the barrier layer to the channel layer, wherein the first gas-supplying cycle includes,
while supplying oxygen gas and a purge gas to a reactor during a first time, a second time, a third time, and a fourth time:
supplying a silicon source during the first time; and
activating the oxygen gas with plasma during the third time,
further comprising repeating a third gas-supplying cycle for forming a capping layer at a lateral surface of the source layer, and
wherein conditions of the first gas-supplying cycle and the third gas-supplying cycle are different.

* * * * *